(12) United States Patent
Kirisawa

(10) Patent No.: US 9,496,151 B2
(45) Date of Patent: *Nov. 15, 2016

(54) SEMICONDUCTOR DEVICE AND SEMICONDUCTOR DEVICE MANUFACTURING METHOD

(71) Applicant: FUJI ELECTRIC CO., LTD., Kawasaki-shi (JP)

(72) Inventor: Mitsuaki Kirisawa, Nagano (JP)

(73) Assignee: FUJI ELECTRIC CO.,LTD., Kawasaki-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/677,409

(22) Filed: Apr. 2, 2015

(65) Prior Publication Data

US 2015/0228779 A1 Aug. 13, 2015

Related U.S. Application Data

(63) Continuation of application No. 14/176,469, filed on Feb. 10, 2014, now Pat. No. 9,059,325, which is a continuation of application No. PCT/JP2012/072822, filed on Sep. 6, 2012.

(30) Foreign Application Priority Data

Sep. 8, 2011 (JP) ................................. 2011-195969

(51) Int. Cl.
*H01L 29/861* (2006.01)
*H01L 21/324* (2006.01)
(Continued)

(52) U.S. Cl.
CPC ........... *H01L 21/324* (2013.01); *H01L 21/265* (2013.01); *H01L 21/2652* (2013.01);
(Continued)

(58) Field of Classification Search
CPC ............. H01L 29/7801; H01L 29/868; H01L 21/265; H01L 29/66128; H01L 21/324

USPC .................. 257/335, 656; 438/530
See application file for complete search history.

(56) References Cited

U.S. PATENT DOCUMENTS 5,342,793 A  8/1994  Santangelo et al.
6,610,572 B1  8/2003  Takei et al.
(Continued)

FOREIGN PATENT DOCUMENTS

EP  0700102 A1  3/1996
JP  4922080  2/1974
(Continued)

OTHER PUBLICATIONS

English translation of applicant submitted IDS JP 2000-058867, Feb. 25, 2000.*

(Continued)

*Primary Examiner* — Christine Enad
(74) *Attorney, Agent, or Firm* — Rossi, Kimms & McDowell LLP

(57) ABSTRACT

In aspects of the invention, an n-type epitaxial layer that forms an n⁻ type drift layer is formed on the upper surface of an n-type semiconductor substrate formed by being doped with a high concentration of antimony. A p-type anode layer is formed on a surface of the n⁻ type drift layer. An n-type contact layer is formed with an impurity concentration in the same region as the impurity concentration of the n-type cathode layer, or higher than the impurity concentration of the n-type cathode layer, on the lower surface of the n-type cathode layer. A cathode electrode is formed so as to be in contact with the n-type contact layer. The n-type contact layer is doped with phosphorus and, without allowing complete recrystallization using a low temperature heat treatment of 500° C. or less, lattice defects are allowed to remain.

10 Claims, 9 Drawing Sheets

(51) Int. Cl.

| | | |
|---|---|---|
| *H01L 29/66* | (2006.01) | |
| *H01L 21/265* | (2006.01) | |
| *H01L 29/78* | (2006.01) | |
| *H01L 29/868* | (2006.01) | |
| *H01L 29/06* | (2006.01) | |
| *H01L 29/167* | (2006.01) | |
| *H01L 21/285* | (2006.01) | |
| *H01L 21/304* | (2006.01) | |
| *H01L 29/08* | (2006.01) | |
| *H01L 29/10* | (2006.01) | |
| *H01L 29/36* | (2006.01) | |
| *H01L 29/45* | (2006.01) | |

(52) U.S. Cl.
CPC ... *H01L21/26513* (2013.01); *H01L 21/28568* (2013.01); *H01L 21/304* (2013.01); *H01L 29/06* (2013.01); *H01L 29/0615* (2013.01); *H01L 29/0878* (2013.01); *H01L 29/1079* (2013.01); *H01L 29/1095* (2013.01); *H01L 29/167* (2013.01); *H01L 29/6609* (2013.01); *H01L 29/66128* (2013.01); *H01L 29/66712* (2013.01); *H01L 29/7801* (2013.01); *H01L 29/7802* (2013.01); *H01L 29/861* (2013.01); *H01L 29/868* (2013.01); *H01L 29/8611* (2013.01); *H01L 29/36* (2013.01); *H01L 29/456* (2013.01)

(56) References Cited

U.S. PATENT DOCUMENTS

| | | | |
|---|---|---|---|
| 2005/0035405 A1* | 2/2005 | Mauder | H01L 29/0834 257/341 |
| 2005/0042864 A1* | 2/2005 | Bruderl et al. | 438/659 |
| 2007/0173045 A1 | 7/2007 | Matsumura et al. | |
| 2007/0235768 A1* | 10/2007 | Nakazawa et al. | 257/211 |
| 2008/0128798 A1 | 6/2008 | Schulze et al. | |
| 2008/0296612 A1* | 12/2008 | Schmidt et al. | 257/139 |
| 2009/0008650 A1* | 1/2009 | Mizukami et al. | 257/77 |
| 2009/0134467 A1* | 5/2009 | Ishida et al. | 257/368 |
| 2009/0159898 A1 | 6/2009 | Fujiwara et al. | |
| 2009/0184384 A1* | 7/2009 | Sanfilippo et al. | 257/432 |
| 2009/0224284 A1 | 9/2009 | Nemoto | |
| 2009/0236611 A1* | 9/2009 | Yamamoto et al. | 257/77 |
| 2011/0024791 A1* | 2/2011 | Schulze | H01L 29/0834 257/109 |
| 2012/0043584 A1* | 2/2012 | Joshi et al. | 257/184 |

FOREIGN PATENT DOCUMENTS

| | | |
|---|---|---|
| JP | 01169970 A | 7/1989 |
| JP | 04214671 A | 8/1992 |
| JP | 2000058867 A | 2/2000 |
| JP | 3069631 B2 | 7/2000 |
| JP | 2001110746 A | 4/2001 |
| JP | 2004039842 A | 2/2004 |
| JP | 2009152309 A | 7/2009 |

OTHER PUBLICATIONS

International Search Report issued in PCTJP2012072822, mailed Oct. 30, 2012.
Extended European Search Report issued in EP12830610.7, mailed Feb. 16, 2015.
Office Action issued in U.S. Appl. No. 14/176,469, mailed Sep. 11, 2014.
Notice of Allowance issued in U.S. Appl. No. 14/176,469, mailed Feb. 10, 2015.
Non-Final Office Action issued in U.S. Appl. No. 14/677,359 dated May 27, 2015.
Notice of Allowance issued in U.S. Appl. No. 14/677,359 mailed Apr. 20, 2016.

* cited by examiner

SEMICONDUCTOR DEVICE AND SEMICONDUCTOR DEVICE MANUFACTURING METHOD

CROSS-REFERENCE TO RELATED APPLICATIONS

This application is a continuation application of U.S. patent application Ser. No. 14/176,469, filed on Feb. 10, 2014, which is a continuation of International Application No. PCT/JP2012/072822, filed on Sep. 6, 2012, which is based on and claims priority to Japanese Patent Application No. JP 2011-195969, filed on Sep 8, 2011. The disclosure of the Japanese priority application, the PCT application, and the U.S. application in their entirety, including the drawings, claims, and the specification thereof, are incorporated herein by reference.

BACKGROUND

1. Field of the Invention

Embodiments of the invention relate to semiconductor devices and semiconductor device manufacturing methods.

2. Related Art

Although power diodes are utilized in various applications, in recent years they are being used in high frequency circuits for power, and the like, and there is a strong demand for high speed, low loss (low Vf (forward voltage drop)), and low Err (reverse recovery loss). Furthermore, there is a strong demand for soft recovery characteristics with an object of, as well as obtaining high speed and low loss, suppressing radiation noise. Hereafter, a description will be given of a p-i-n (p-intrinsic-n) diode structuring method.

FIGS. 9(a)-9(f) are sectional views showing conditions partway through the manufacture of a heretofore known semiconductor device. Firstly, there is prepared a low resistivity (approximately 20 mΩcm) n-type semiconductor substrate (an antimony-doped substrate) with a thickness of 625 μm doped with antimony (Sb). This n-type semiconductor substrate is an n-type cathode layer 51. Next, there is fabricated a wafer wherein an n-type epitaxial layer 100 with a thickness of 60 μm and a resistivity of 20 Ωcm is formed by being epitaxially grown on the semiconductor substrate while doping with phosphorus (P) (FIG. 9(a)).

Next, an implantation of boron (B) ions into the front surface (the surface on the n-type epitaxial layer 100 side) of the wafer is carried out to a dose of $7.0 \times 10^{13}/cm^2$, after which heat treatment is carried out at a temperature of 1,150° C., by doing which a p-type anode layer 53 is selectively formed in a surface layer of the n-type epitaxial layer 100 (FIG. 9(b)). The n-type epitaxial layer 100 sandwiched between the p-type anode layer 53 and n-type cathode layer 51 becomes an n⁻ type drift layer 52.

Next, a grinding and etching 68 of the back surface (the surface on the n-type cathode layer 51 side) is carried out until the total thickness of the wafer is, for example, 300 μm (FIG. 9(c)). Next, after an ion implantation 69 of arsenic (As) is carried into the back surface of the wafer on which the grinding and etching 68 has been carried out in order to ensure good ohmic contact, heat treatment is carried out at a temperature of 1,000° C. or more, thus forming an n-type contact layer 54 in the ground back surface of the wafer (FIG. 9(d)).

Next, an anode electrode 55 is formed of aluminum (Al) or the like on the wafer front surface (FIG. 9(e)). Subsequently, a cathode electrode 56 is deposited by vapor deposition, or the like, on the wafer back surface (FIG. 9(f)), thereby completing the heretofore known p-i-n diode. Reference sign 57 in the drawing is an interlayer dielectric that isolates the anode electrode 55 and n-type epitaxial layer 100 with an edge termination structure region. This kind of heretofore known diode structure and manufacturing method are proposed in, for example, Japanese Patent Application Publication No. JP-A-2004-39842.

Also, as a method of realizing ohmic contact between a semiconductor substrate (wafer) and metal electrode, there has been proposed a method whereby, after the thickness of the semiconductor substrate is reduced by etching or the like, an impurity of the same conductivity as the semiconductor substrate is ion implanted, and a high concentration layer formed in the semiconductor substrate surface by activating the impurity by heat treatment at in the region of 800° C., thus obtaining good ohmic contact. See, for example, Japanese Patent Application Publication No. JP-A-49-22080 (also referred to herein "PTL 2").

Also, as another method, there has been proposed a method whereby a low temperature heat treatment is carried out in order to avoid an adverse effect of a high temperature heat treatment on a semiconductor substrate front surface side device structure. See, for example, Japanese Patent Application Publication No. JP-A-4-214671 (also referred to herein as "PTL 3"). In PTL 3, after an ion implantation is carried out into the semiconductor substrate back surface, a titanium (Ti) layer, of a plurality of metal layers stacked as a back surface electrode, is deposited first, and the remainder of the metal layers that form the back surface electrode are deposited after a heat treatment is carried out at a low temperature of 400° C. or less for a short time of 30 minutes or less. It is disclosed that at this time, in the case of an n-type silicon substrate, the impurity ion-implanted into the substrate back surface is arsenic (As).

Also, as another method, there is proposed a method whereby an n-type impurity with which a low resistivity n-type semiconductor substrate is doped is arsenic. See, for example, Japanese Patent Application Publication No. JP-A-2000-58867 (also referred to as "PTL 4"). By adopting an arsenic-doped n-type semiconductor substrate (an arsenic-doped substrate), as in PTL 4, it is possible for the n-type impurity concentration of the n-type semiconductor substrate to be $1.0 \times 10^{19}/cm^3$ or more. This is because the solid solubility of arsenic is higher than the solid solubility of antimony. As the impurity concentration of the arsenic-doped substrate is high enough that ohmic contact with a metal electrode is possible in this way, it is possible to form a back surface electrode on the substrate itself, without forming a high concentration impurity layer using an ion implantation, or the like.

In recent years, there has been a strong demand for high reliability, meaning an improvement in heat cycle tolerance, in power devices, and there is a demand for chips to be thinner than to date in order to realize high reliability. Furthermore, along with a reduction in wafer thickness in order for chips to be thinner than to date, there has been an increase in wafer size in order to reduce cost, because of which there is a large problem of reducing the rate of crack defects caused by the reduction in wafer thickness. In order to suppress cracking of wafers reduced in thickness without large equipment investment, the degree to which the number of processing steps after reducing the wafer thickness can be reduced is important.

The heretofore known p-i-n diode manufacturing method shown in FIG. 9 is such that the thickness is reduced by grinding the wafer back surface and, after arsenic is ion implanted into the ground back surface of the wafer and a high temperature heat treatment is carried out, the front surface element structure, including the front surface electrode, and the back surface electrode are formed. This method is such that, as the step of forming the front surface element structure and the step of forming the back surface electrode are carried out with the wafer in a thin state, it is difficult to handle (convey) the wafer so as to avoid cracking of the wafer, scratching of the front surface and back surface, and the like, and there is a problem in that the yield rate decreases. Also, when forming the n-type contact layer 54 on the wafer back surface, it is necessary to carry out the heat treatment after the arsenic ion implantation at a temperature of in the region of 1,000° C., and wafer warpage is liable to occur. Flatness of the wafer front surface is lost due to the warpage, and there is a problem in that patterning of the front surface electrode formation, and the like, in a subsequent step is difficult.

Also, as previously described, problems with an antimony-doped substrate are that the solid solubility is low, the resistivity is high compared with the resistivity of an arsenic-doped substrate, contact resistance with the cathode electrode increases because of the high resistivity, and there is an increase in variation of contact resistance with the cathode electrode. A method whereby, after the thickness of the semiconductor substrate is reduced, an impurity (phosphorus) introduced into the wafer back surface by a high concentration ion implantation is subjected to a heat treatment at a high temperature of 800° C. or more, thereby forming a high concentration layer in order to obtain ohmic contact, as in PTL 2, is feasible as a method of eliminating these problems.

However, the kind of method in PTL 2 is such that, as the melting point of aluminum, which is commonly used as the front surface electrode, is in the region of 660° C., a large number of steps, such as an aluminum film formation and a photo etching, are carried out with the wafer in a state of reduced thickness. As a result of this, the frequency of mechanical stress exerted by a wafer chuck, or the like, increases, and a new problem occurs in that the probability of the wafer cracking becomes extremely high.

Meanwhile, when a high concentration of phosphorus is ion implanted into a semiconductor substrate, a large number of defects remain in the implantation surface and, depending on the implantation dose, it may happen that the ion implantation layer becomes amorphous. However, when the heat treatment temperature is lower than 800° C., as in PTL 3, the crystallization of the ion implantation layer does not recover, and a large number of defects remain. When a large number of defects remain and crystallization does not recover in this way, the introduced impurity is not electrically activated. Because of this, the resistance of the contact with the electrode increases, and there is a problem in that the forward voltage drop of the diode increases.

When using an arsenic-doped substrate rather than an antimony-doped substrate, as in PTL 4, there is no need to form a high concentration impurity layer on the cathode side and, after all of the front surface element structure, such as the front surface electrode formation, is formed, it is possible to form the cathode electrode immediately after the thickness of the wafer is reduced. Consequently, the only step carried out on the wafer reduced in thickness is the step of forming the back surface electrode, which is advantageous in preventing cracking of the wafer. However, there is a problem in that an arsenic-doped substrate is generally more expensive than an antimony-doped substrate. Furthermore, a wafer wherein an n-type epitaxial layer is formed on an arsenic-doped substrate is such that the in-plane resistance value of the wafer is liable to vary due to auto-doping from the arsenic-doped substrate during epitaxial growth, and there is a problem in that the device characteristics vary.

SUMMARY OF THE INVENTION

Embodiments of the invention, in order to address heretofore described problems with the heretofore known technology, provide a semiconductor device and semiconductor device manufacturing method such that it is possible to reduce wafer cracking during the manufacturing process, and to ensure good ohmic contact between a semiconductor layer and a metal electrode.

A semiconductor device according to embodiments of the invention has the following characteristics. A first conductivity type contact layer with a concentration higher than that of a first conductivity type semiconductor substrate is provided on the back surface of the semiconductor substrate. A first electrode is provided in contact with the contact layer. The contact layer is doped with phosphorus. The maximum carrier concentration of the contact layer is greater than $1.0 \times 10^{18}/cm^3$ and less than $5.0 \times 10^{19}/cm^3$. The diffusion depth of the contact layer from the interface with the first electrode into the semiconductor substrate is 0.5 μm or less.

Also, it is good when the semiconductor device according to the invention is such that the maximum carrier concentration of the contact layer is greater than $3.0 \times 10^{18}/cm^3$ and less than $1.0 \times 10^{19}/cm^3$. Also, it is good when the semiconductor device according to the invention is such that the semiconductor substrate is doped with antimony, and the concentration of antimony in the semiconductor substrate is $1.0 \times 10^{18}/cm^3$ or more, $3.0 \times 10^{18}/cm^3$ or less. Also, it is good when the semiconductor device according to the invention is such that titanium is included in a portion of the first electrode on the side in contact with the contact layer.

Also, the semiconductor device according to embodiments of the invention further includes a first conductivity type drift layer, provided on the front surface of the semiconductor substrate, with a concentration lower than that of the semiconductor substrate. Further, it is good when the total of the thickness of the drift layer and the thickness of the semiconductor substrate is less than 300 μm.

Also, the semiconductor device according to embodiments of the invention is such that a second conductivity type base region is provided in a surface layer on the side of the drift layer opposite to that of the semiconductor substrate. A second electrode electrically connected to the base region may be provided.

Also, the semiconductor device according to embodiments of the invention is such that a first conductivity type source region with a concentration higher than that of the drift layer is provided inside the base region. A gate electrode may be provided across a dielectric on a portion of the surface of the drift layer sandwiched by the source region and base region.

Also, in order to address some of the heretofore described problems, a semiconductor device manufacturing method according to embodiments of the invention has the following characteristics. Firstly, a step of grinding the back surface of a first conductivity type semiconductor substrate formed by being doped with antimony, thereby reducing the thickness of the semiconductor substrate, is carried out. Next, a step of ion implanting a first conductivity type impurity into the ground back surface of the semiconductor substrate is carried out. Next, a step of activating the first conductivity type impurity implanted into the semiconductor substrate by carrying out a heat treatment for 30 minutes or more at a temperature of 340° C. or more, 500° C. or less, thereby forming a first conductivity type contact layer in a surface layer of the back surface of the semiconductor substrate, is carried out. Next, a step of forming a first electrode in contact with the contact layer is carried out.

Also, it is good when the semiconductor device manufacturing method according to the invention is such that the first conductivity type impurity is phosphorus. Also, it is good when the semiconductor device manufacturing method according to the invention is such that the dose of the ion implantation first conductivity type impurity is $4.0\times10^{13}/\text{cm}^2$ or more, $5.6\times10^{14}/\text{cm}^2$ or less.

Also, it is good when the semiconductor device manufacturing method according to the invention is such that, when taking the heat treatment temperature to be x (° C.) and the dose of the first conductivity type impurity to be y (/cm$^2$), $y=-5.7\times10^{14}+2.012\times10^{12}x$ is satisfied, and $0.9y \leq x \leq 1.1y$ is satisfied.

Also, it is good when the semiconductor device manufacturing method according to the invention is such that the acceleration energy of the ion implantation is 5 keV or more, 50 keV or less. Also, it is good when the semiconductor device manufacturing method according to the invention is such that the first electrode includes titanium.

Also, the semiconductor device manufacturing method according to embodiments of the invention is such that a step of epitaxially growing a first conductivity type drift layer with a concentration lower than that of the semiconductor substrate on the front surface of the semiconductor substrate is carried out before grinding the back surface of the semiconductor substrate. Further, it is good when the total of the thickness of the drift layer and the thickness of the semiconductor substrate after grinding the semiconductor substrate is less than 300 μm.

Also, the semiconductor device manufacturing method according to embodiments of the invention is such that a step of forming a second conductivity type base region in a surface layer on the side of the drift layer opposite to that of the semiconductor substrate is carried out after forming the drift layer and before grinding the semiconductor substrate. Next, it is good when a step of forming a second electrode electrically connected to the base region is carried out.

A point regarding the configuration of the semiconductor device of embodiments of the invention is the first conductivity type contact layer formed on the back surface of the first conductivity type semiconductor substrate and having the three characteristics shown in (1) to (3) below. (1) The first conductivity type contact layer is doped with phosphorus and, without allowing complete recrystallization, lattice defects are allowed to remain. (2) The maximum carrier concentration of the first conductivity type contact layer is greater than $1.0\times10^{18}/\text{cm}^3$, and less than $5.0\times10^{19}/\text{cm}^3$. (3) The diffusion depth from the lower surface of the first conductivity type contact layer (the interface with the first electrode) into the first conductivity type semiconductor substrate is 0.5 μm or less.

Also, a point of the semiconductor device manufacturing method of the invention is that the step of carrying out a heat treatment on the first conductivity type impurity ion implanted in order to form the first conductivity type contact layer is carried out at a temperature of 340° C. or more, 500° C. or less.

Consequently, according to embodiments of the invention, it is possible, by employing a first conductivity type contact layer having the characteristics of (1) to (3) above, for the contact between a first conductivity type contact layer and first electrode to be a low-resistance ohmic contact equivalent to that when carrying out heat treatment at a high temperature (800° C. or higher), even when carrying out heat treatment on an ion implanted first conductivity type impurity at a low temperature of 500° C. or lower.

Also, according to embodiments of the invention, it is possible to bring the first conductivity type contact layer and first electrode into ohmic contact with a heat treatment at a low temperature of 500° C. or lower, because of which, it is possible to form a front surface element structure on the front surface of the first conductivity type semiconductor substrate before reducing the thickness by grinding the back surface of the first conductivity type semiconductor substrate. Because of this, it is possible to reduce the number of processing steps after reducing the thickness of the first conductivity type semiconductor substrate. Consequently, it is possible to reduce processes of handling (conveying) the first conductivity type semiconductor substrate (wafer) to each manufacturing step during the manufacturing process.

As heretofore described, according to embodiments of the invention, it is possible to provide a semiconductor device and semiconductor device manufacturing method such that it is possible to reduce wafer cracking during the manufacturing process, and to ensure good ohmic contact between a semiconductor layer and a metal electrode.

DETAILED DESCRIPTION

Hereafter, referring to the attached drawings, a detailed description will be given of preferred embodiments of a semiconductor and semiconductor manufacturing method according to the invention. In the description and attached drawings, a layer or region being prefixed by n or p means that electrons or holes respectively are majority carriers. Also, + or − being added to n or p means that there is a higher impurity concentration or lower impurity concentration respectively than in a layer or region to which n or p is not added. The same reference signs are given to the same configurations in the following embodiment descriptions and attached drawings, and a redundant description is omitted.

Also, in each embodiment, a description is given with a first conductivity type as an n-type and a second conductivity type as a p-type, but the first conductivity type may also be a p-type and the second conductivity type an n-type. Also, the expressions device, element, and chip or semiconductor chip are also used in the invention, but they all indicate the same subject. Also, a wafer in the description is a silicon substrate before being fragmented into chips. Also, the front surface of a silicon substrate is also written as the upper surface, and the back surface as the lower surface. A semiconductor is not limited to silicon. Also, a front surface electrode is formed on a semiconductor chip, and a region through which current flows when in an on-state is taken to be an "active region". Also, a structural portion, which is a portion from an end portion of the active region to an outer peripheral end portion of the chip enclosing the active region, that alleviates chip surface electrical field intensity generated when voltage is applied to an element formed on the chip is taken to be a "edge termination structure region".

(Embodiment 1)

Figure 1:
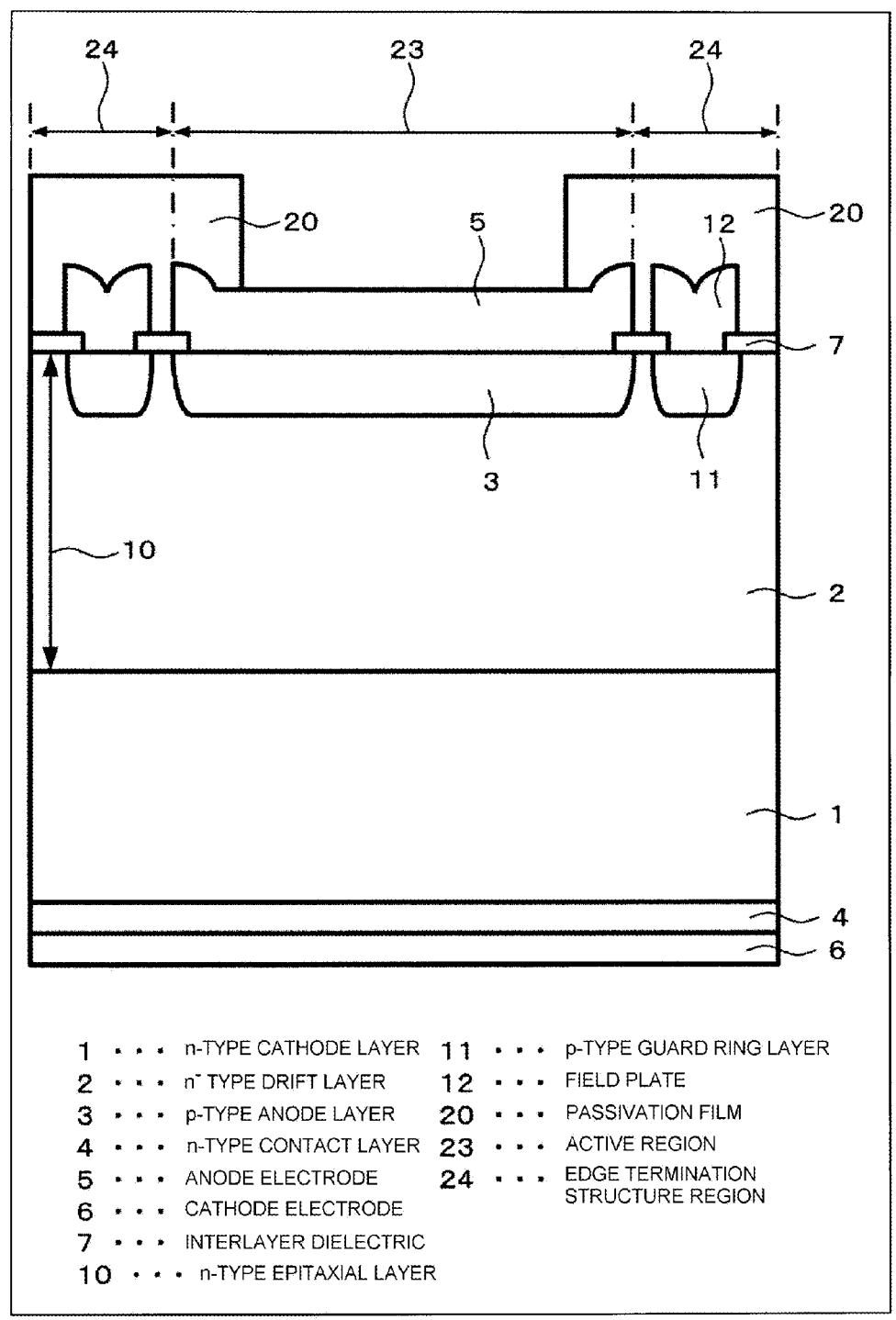
FIG. 1 is a sectional view showing a main portion of a semiconductor device according to Embodiment 1 of the invention.

A description will be given of the structure of a semiconductor device according to Embodiment 1, with a diode as an example. FIG. 1 is a sectional view showing a main portion of the semiconductor device according to Embodiment 1 of the invention. As shown in FIG. 1, the diode according to Embodiment 1 is such that an n-type epitaxial layer 10 is formed on the upper surface of an n-type semiconductor substrate (an n-type cathode layer 1) formed by doping with a high concentration of antimony. The semiconductor substrate is mainly a single-crystal silicon substrate manufactured using the Czochralski (CZ) process.

The impurity concentration of the antimony (Sb) with which the silicon substrate is doped is a high concentration of in the region of $1.0 \times 10^{18}/cm^3$ or more, $3.0 \times 10^{18}/cm^3$ or less, which is the solid solubility in the vicinity of the melting temperature (1,414° C.) of silicon. This kind of substrate doped with a high concentration of antimony is preferable, as the diode has a low resistance and low forward voltage. Also, the n-type epitaxial layer 10 forms an n⁻ type drift layer 2. The impurity concentration of the n⁻ type drift layer 2 is lower than the impurity concentration of the n-type cathode layer 1. When a reverse bias voltage is applied to the diode, a depletion layer spreads inside the n⁻ type drift layer 2.

An active region 23, which is a region through which a main current is caused to flow, and a edge termination structure region 24 for alleviating the electrical field intensity of the depletion layer are formed on a surface (the surface on the side opposite to the n-type cathode layer 1 side) of the n⁻ type drift layer 2. The edge termination structure region 24 encloses the outer periphery of the active region 23. A p-type anode layer 3 (also called a p-type base layer) of a concentration higher than that of the n⁻ type drift layer 2 is formed in the surface of the active region 23. A p-n junction is formed between the p-type anode layer 3 and n⁻ type drift layer 2. An anode electrode 5 is formed on the surface of the p-type anode layer 3, ohmically connected to the p-type anode layer 3.

The structure may also be such that the p-type anode layer 3 is selectively formed in the surface of the active region 23, so that the n⁻ type drift layer 2 and anode electrode 5 are in Schottky contact in a region of the active region 23 surface in which the p-type anode layer 3 is not formed. An interlayer dielectric 7, a p-type guard ring layer 11, and a field plate 12 connected to the p-type guard ring layer 11 are formed on the surface of the edge termination structure region 24. A heretofore known RESURF structure may be formed on the edge termination structure region 24 instead of the guard ring structure.

A passivation film 20 is formed on the surface of the n⁻ type drift layer 2 so as to reach from the edge termination structure region 24 to an end portion of the active region 23. A heretofore known resin film such as a polyimide, a silicon nitride film, a silicon oxide film, or the like, is used as the passivation film 20. Meanwhile, an n-type contact layer 4 is formed with an impurity concentration equivalent to or greater than that of the n-type cathode layer 1 on the lower surface (the surface on the side opposite to the n⁻ type drift layer 2 side) of the n-type cathode layer 1, and a cathode electrode 6 is formed so as to be in ohmic contact with the n-type contact layer 4.

An important point regarding the configuration of the diode according to Embodiment 1 is the n-type contact layer 4, with the n-type contact layer 4 having the three characteristics shown in (1) to (3) below. (1) The n-type contact layer 4 is doped with phosphorus (P) and, without allowing complete recrystallization, lattice defects (mainly point defects) are allowed to remain. (2) The maximum carrier concentration of the n-type contact layer 4 is greater than $1.0 \times 10^{18}/cm^3$, and less than $5.0 \times 10^{19}/cm^3$. (3) The diffusion depth from the lower surface of the n-type contact layer 4 (the interface with the cathode electrode) into the n-type cathode layer 1 is 0.5 μm or less.

By adopting the n-type contact layer 4 having the three characteristics of the heretofore described (1) to (3), the invention is such that, even though the phosphorus ion-implanted in order to form the n-type contact layer 4 is subjected to heat treatment (a back surface contact heat treatment to be described hereafter) at a low temperature of 500° C. or less, it is possible to form a diode with a low resistance in the region of that when carrying out heat treatment at a high temperature (800° C. or more). In particular, effects of the reduction in resistance obtained because of the three characteristics of the heretofore described (1) to (3) are peculiar effects not seen in heretofore known technology. Peculiar operational effects owing to the three characteristics of the heretofore described (1) to (3) are described in Examples 1 to 5, to be described hereafter.

Next, using FIG. 2, a description will be given of a diode manufacturing method according to Embodiment 1. FIG. 2 is sectional views showing conditions partway through the manufacture of the semiconductor device according to Embodiment 1 of the invention. Firstly, there is prepared an n-type low resistivity (approximately 20 mΩcm) CZ silicon substrate with a thickness of 625 μm, doped with antimony (Sb) roughly to solid solubility, fabricated using the CZ process. This silicon substrate is the n-type cathode layer 1. Mirror finishing is carried out by polishing the surface of the silicon substrate, and there is fabricated a wafer wherein the 20 Ωcm n-type epitaxial layer 10 with a thickness of 60 μm is formed by being epitaxially grown on the mirror-finished silicon substrate surface while doping with phosphorus (FIG. 2(a)).

Figure 2A:
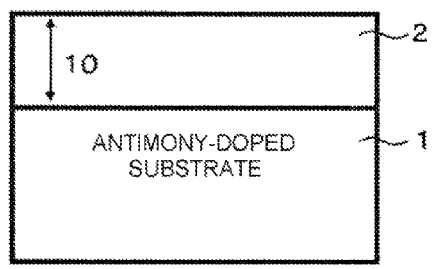
FIGS. 2(a)-2(f) are sectional views showing conditions partway through the manufacture of the semiconductor device according to Embodiment 1 of the invention.
Figure 2B:
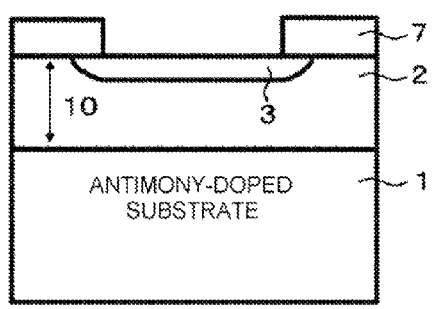
Figure 2C:
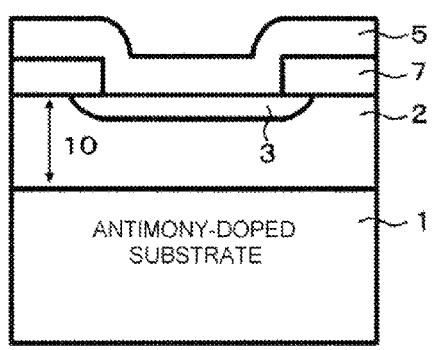
Figure 2D:
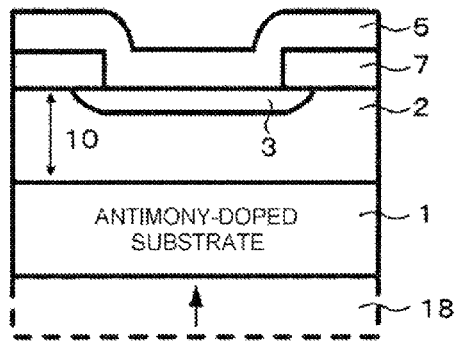

Next, an implantation of boron ions into the front surface (the surface on the n-type epitaxial layer 10 side) of the wafer is carried out to a dose of $7.0 \times 10^{13}/cm^2$, after which heat treatment is carried out at 1,150° C., by doing which the p-type anode layer 3 is formed in a surface layer of the wafer front surface in the active region 23 (FIG. 2(b)). The n-type epitaxial layer 10 sandwiched between the p-type anode layer 3 and n-type cathode layer 1 becomes the n⁻ type drift layer 2. Next, the anode electrode 5 is formed of a metal film including aluminum on the surface of the p-type anode layer 3 (FIG. 2(c)). Subsequently, a grinding and etching 18 of the back surface (the surface on the n-type cathode layer 1 side) of the wafer is carried out so that the remaining total thickness of the wafer is, for example, 200 μm (FIG. 2(d)).

Figure 2E:
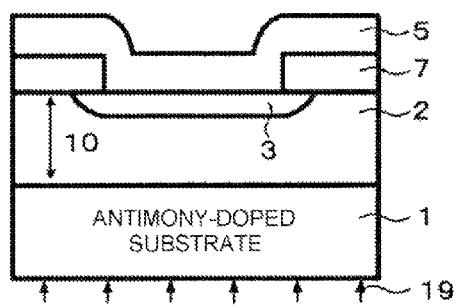

Next, an ion implantation 19 of, for example, phosphorus (hereafter referred to as a back surface phosphorus ion implantation) is carried out to a dose of $4.0 \times 10^{13}/cm^2$ to $5.6 \times 10^{14}/cm^2$ into the back surface of the wafer on which the grinding and etching 18 has been carried out, using an acceleration energy of 5 keV or more, 50 keV or less (FIG. 2(e)). Next, heat treatment is carried out at a temperature of 340° C. or more, 500° C. or less, thus forming the n-type contact layer 4 in a surface layer of the wafer back surface. The heat treatment when forming the n-type contact layer 4 will hereafter be referred to as the "back surface contact heat treatment". The formation of the low resistance n-type contact layer 4 is possible provided that the acceleration energy of the back surface phosphorus ion implantation 19 is within the above-mentioned range. Also, by the back surface contact heat treatment being carried out in the above-mentioned temperature range, with the dose of the back surface phosphorus ion implantation 19 in the above-mentioned range, it is possible to form the n-type contact layer 4 having the three characteristics of the invention indicated in the previously described (1) to (3).

Figure 2F:
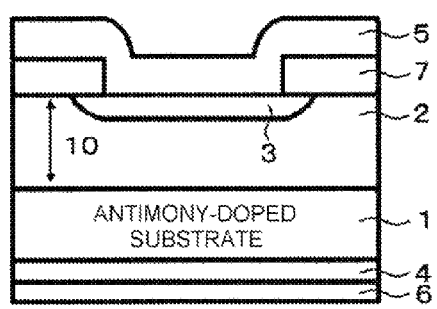

Next, the diode according to Embodiment 1 shown in FIG. 1 is completed by the cathode electrode 6 being formed by evaporation coating of a titanium (Ti) film on the n-type contact layer 4, thus ensuring the ohmic contact of the cathode electrode 6 and n-type contact layer 4 (FIG. 2(f)). Titanium, which is the material configuring the cathode electrode 6, is a metal preferred as an ohmic electrode for n-type silicon as it has high thermal stability, film formation is easy, and the manufacturing cost is low. The cathode electrode 6 may also be formed by evaporation coating of a nickel (Ni) film, a silver (Ag) film, or a gold (Au) film on top of the titanium film.

It is preferable that the back surface contact heat treatment in the formation of the n-type contact layer 4 is carried out before the formation (deposition) of the metal films that form the cathode electrode 6. The reason is as follows. When the back surface contact heat treatment is carried out at a temperature of in the region of 400° C. after the titanium film that forms the cathode electrode 6 is deposited on the wafer back surface using, for example, a evaporation coating equipment, and a nickel film and gold film that form the cathode electrode 6 are additionally deposited on the titanium film when the wafer temperature subsequently decreases, the nickel in the nickel film is deposited on the gold film surface due to the heat remaining in the wafer. When the wafer is removed from the evaporation coating equipment in this condition, the nickel deposited on the gold film surface oxidizes. When the oxidized nickel on the gold film surface is packaged in a mold or the like, it causes a reduction in the wettability with respect to the cathode electrode 6 on the chip back surface of the solder that joins the electrode plate and the cathode electrode 6 on the chip back surface. Because of this, there is a problem in that a void is liable to form between the solder and cathode electrode 6. For this reason, it is preferable that the back surface contact heat treatment in the formation of the n-type contact layer 4 is carried out before the formation (deposition) of the metal films that form the cathode electrode 6. Also, as nickel is also deposited on the gold film surface when the back surface contact heat treatment is carried out after all the metal films that form the cathode electrode 6 are deposited on the wafer back surface, the same problem occurs as when carrying out the back surface contact heat treatment after the titanium film is deposited. Consequently, it is preferable that the back surface contact heat treatment is carried out before the metal films are deposited.

In some embodiments, it is preferable that total of the thickness of the n-type cathode layer 1 and the thickness of the n⁻ drift layer 2 is less than 300 μm, in a range wherein the remaining wafer thickness (total wafer thickness) when grinding the wafer from the back surface is not less than the thickness of the n⁻ drift layer 2 (that is, the n-type cathode layer 1 remains). The reason is that the heat capacity of the silicon substrate decreases further the thinner the chip becomes, and heat cycle tolerance improves. Also, when also taking a wafer crack defect into consideration, it is more preferable still that the remaining wafer thickness is greater than 120 μm, and less than 300 μm.

(Example 1)

Figure 3:
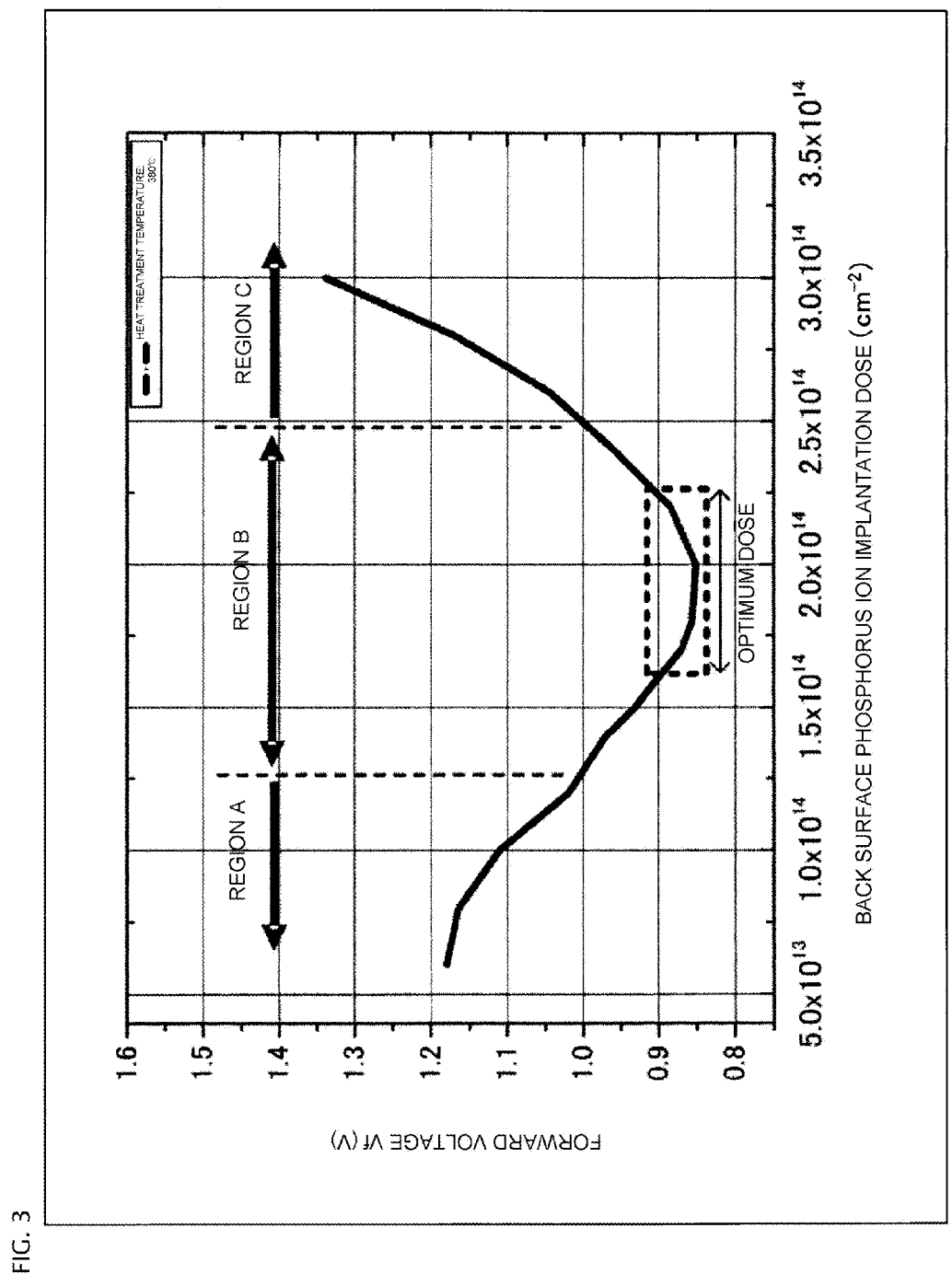
FIG. 3 is a characteristic diagram showing the relationship between the forward voltage characteristics of the semiconductor device and the back surface phosphorus ion implantation dose according to Example 1 of the invention.

Next, a description will be given of the relationship between the forward voltage characteristics of the semiconductor device according to the invention and the dose of the back surface phosphorus ion implantation 19. FIG. 3 is a characteristic diagram showing the relationship between the forward voltage characteristics of the semiconductor device and the back surface phosphorus ion implantation dose according to Example 1 of the invention. FIG. 3 shows the relationship between the dose of the back surface phosphorus ion implantation 19 and the forward voltage (Vf) characteristics of the diode when the temperature of the back surface contact heat treatment is 380° C. The definition of the forward voltage (Vf) is that it is the value of the forward voltage drop between the anode electrode and cathode electrode when a forward bias voltage is applied between the anode electrode and cathode electrode of a diode chip of 5 mm both vertically and horizontally, and the forward current is 5 amperes (A). The current density of the forward current depends on the area of the active region 23, and is in the region of, for example, 30 A/cm² (the same also applies in the other examples).

As heretofore known, when no n-type contact layer for ohmic contact is formed on the back surface side of an antimony-doped substrate (hereafter referred to as heretofore known example 1), the forward voltage value (hereafter referred to as the Vf value) is approximately 1.1 to 1.2 V (not shown). Also, the Vf value when an implantation of phosphorus ions into the back surface of an antimony-doped substrate is carried out and heat treatment implemented at a high temperature of 800° C. or more (hereafter referred to as heretofore known example 2) is approximately 0.8 V (not shown). 0.3 V to 0.4 V, which is the difference from the Vf value of heretofore known example 2, is the contact loss (the voltage drop caused by the contact resistance) due to the antimony-doped substrate in heretofore known example 1. When using an arsenic-doped substrate too (hereafter referred to as heretofore known example 3), the Vf value, in the same way, is approximately 0.8 V (not shown).

Meanwhile, from the results shown in FIG. 3, it is confirmed that when the dose of the back surface phosphorus ion implantation 19 is $1.25 \times 10^{14}/cm^2$ or less, the Vf value is higher than 1.0 V, and furthermore, with a dose lower than $1.0 \times 10^{14}/cm^2$, the Vf value is in the region of 1.15 V, which is in the same region as the Vf value of heretofore known example 1, in which the back surface phosphorus ion implantation 19 is not carried out. The range of the dose of the back surface phosphorus ion implantation 19 when the Vf value is in the same region as the Vf value of heretofore known example 1 in this way is referred to as region A. When the dose of the back surface phosphorus ion implantation 19 is in region A, it means simply that the amount of n-type impurity for lowering the contact resistance of the back surface of the antimony-doped substrate is insufficient.

Conversely, when the dose of the back surface phosphorus ion implantation 19 is $2.5 \times 10^{14}/cm^2$ or more, the Vf value rises sharply. In particular, it is confirmed that the Vf value is 1.3 V or higher when the dose of the back surface phosphorus ion implantation 19 is $3.0 \times 10^{14}/cm^2$, which far exceeds the contact loss due to the antimony-doped substrate in heretofore known example 1. This range of the dose of the back surface phosphorus ion implantation 19 is referred to as region C. When the dose of the back surface phosphorus ion implantation 19 is in region C, Si damage occurring in the antimony-doped substrate when the back surface phosphorus ion implantation 19 is carried out is not recovered by heat treatment at a temperature of 380° C., a large amount remains, and it is presumed that, as well as contact resistance increasing, this is further added to the contact loss due to the antimony-doped substrate.

As opposed to this, when the dose of the back surface phosphorus ion implantation 19 is $1.0 \times 10^{14}/cm^2$ or more, $2.7 \times 10^{14}/cm^2$ or less (the high dose side of region A and the low dose side of region C), it is possible to reduce the Vf value (the Vf value is 1.1 V or lower) further than the Vf value (1.1 to 1.2 V) when not forming an n-type contact layer, as in heretofore known example 1. The effect wherein the resistance is lower than the Vf value of heretofore known example 1 in this way is referred to as a first effect of the invention. Also, when the dose of the back surface phosphorus ion implantation 19 is $1.25 \times 10^{14}/cm^2$ or more, $2.5 \times 10^{14}/cm^2$ or less, an effect of a noticeable reduction in resistance is exhibited in that it is possible to further reduce the above-mentioned Vf value by 0.1 V or more (the Vf value is 1.0 V or lower). This resistance reduction effect is referred to as a second effect. Also, the range of the dose of the back surface phosphorus ion implantation 19 wherein it is possible in this way to reduce the Vf value by 0.1 V or more compared to the Vf value of heretofore known example 1, in which the back surface phosphorus ion implantation 19 is not carried out, is referred to as region B.

Furthermore, when the dose of the back surface phosphorus ion implantation 19 is $1.6 \times 10^{14}/cm^2$ or more, $2.3 \times 10^{14}/cm^2$ or less (a dose in the vicinity of the middle of region B), it is possible, even though the heat treatment is carried out at low temperature, to reduce the Vf value to the same region (the Vf value is less than 1.0 V, or 0.9 V or less) as the Vf value of heretofore known example 2 wherein the n-type contact layer is formed by a high temperature heat treatment (800° C. or more). Furthermore, provided that variation in the dose of the back surface phosphorus ion implantation 19 is within the above-mentioned range, the Vf value is within a range from a minimum value (0.85 V) to in the region of 5% from the minimum value, hardly varying, because of which the range of the dose of the back surface phosphorus ion implantation 19 is such that the Vf characteristics are stable. An effect wherein stable resistance reduction can be realized in this way is a peculiar effect that is not obtained with a heretofore known configuration, and this effect is referred to as a third effect. Also, the range of the dose of the back surface phosphorus ion implantation 19 exhibiting the third effect, that is, the dose within a range wherein the Vf value is less than 1.0 V, and furthermore, exhibits a deviation between the minimum value (0.85 V) and in the region of 5% from the minimum value, is referred to as an optimum dose (the portion enclosed by the dotted line rectangle in FIG. 3).

To summarize the heretofore described operational effects of the invention, it is confirmed that the three operational effects of (i) to (iii) below are obtained. (i) The doses of the back surface phosphorus ion implantation 19 exhibiting the first to third effects, rather than being so-called high doses of $1.0 \times 10^{15}/cm^2$ or more, are doses sufficiently lower than that. (ii) The back surface contact heat treatment is a heat treatment at a so-called low temperature (500° C. or lower) of 380° C. (iii) Even the cases in (i) and (ii) above exhibit a Vf value equivalent to the value of Example 2 wherein a high temperature (800° C. or higher) heat treatment is carried out. As a heretofore known solid-phase epitaxial growth is such that the phosphorus dose is $1.0 \times 10^{15}/cm^2$ or more, the dose of the back surface phosphorus ion implantation 19 is a dose nearly ten times smaller than in the case of the heretofore known solid-phase epitaxial growth. The operational effects indicated in (i) to (iii) above are unique phenomena caused by an ion implantation of phosphorus into a surface (the back surface is indicated in the invention) of an antimony-doped substrate, and are peculiar operational effects that are not obtained from heretofore known technology. It is supposed that the physical reason the peculiar operational effects indicated in (i) to (iii) above are obtained in this way is the interaction between the dopant (herein, phosphorus atoms) of the n-type contact layer 4, the high concentration substrate dopant (herein, antimony atoms), and the remaining lattice defects (mainly point defects).

(Example 2)

Figure 4:
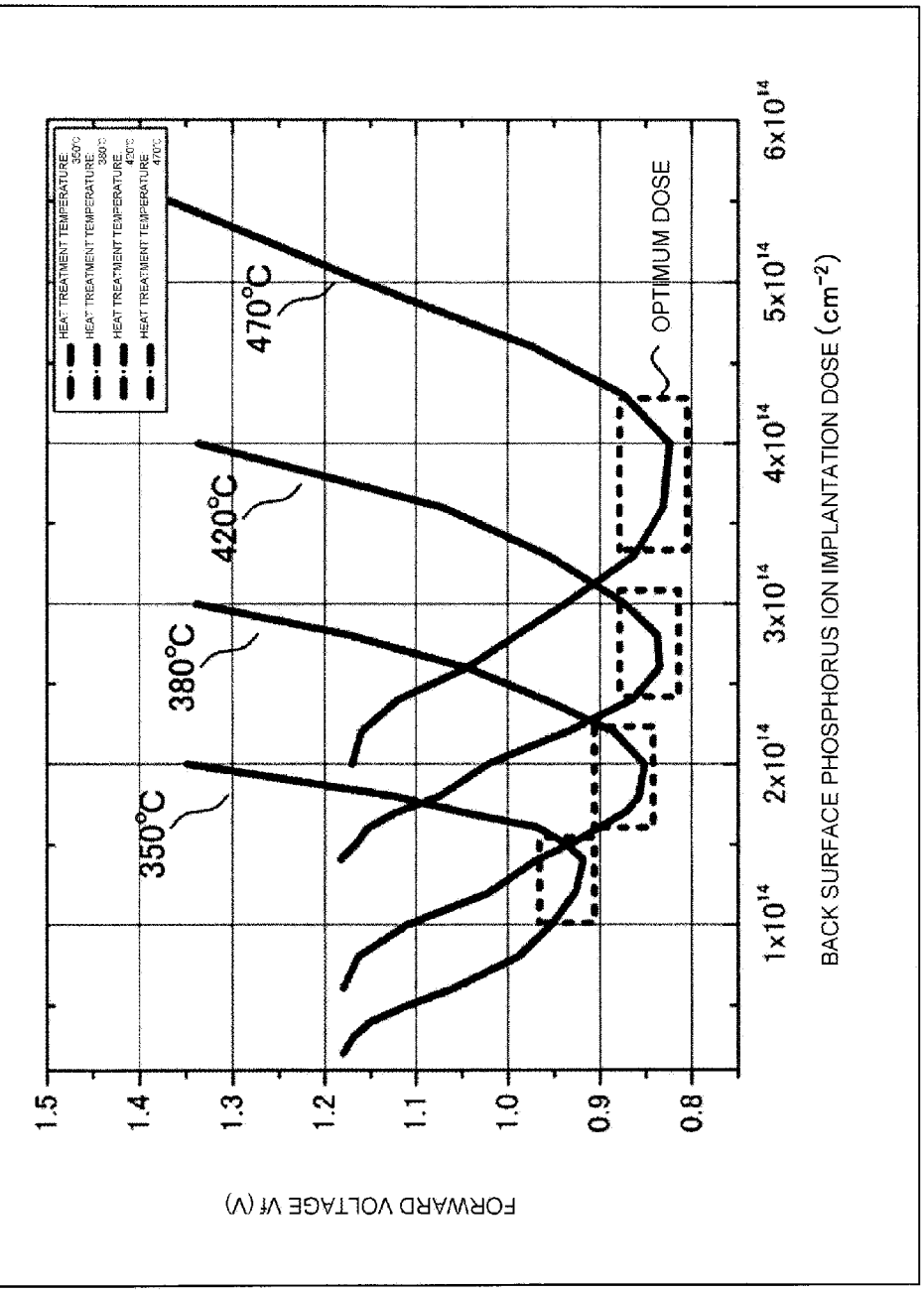
FIG. 4 is a characteristic diagram showing the relationship between the forward voltage characteristics of the semiconductor device and the back surface contact heat treatment temperature according to Example 2 of the invention.

Next, a description will be given of the relationship between the forward voltage characteristics of the semiconductor device according to the invention and the temperature of the back surface contact heat treatment. FIG. 4 is a characteristic diagram showing the relationship between the forward voltage characteristics of the semiconductor device and the back surface contact heat treatment temperature according to Example 2 of the invention. FIG. 4 shows the relationship between the dose of the back surface phosphorus ion implantation 19 and the diode Vf characteristics at four kinds of back surface contact heat treatment temperature (350° C., 380° C., 420° C., and 470° C.), including that of Example 1 (380° C.).

From the results shown in FIG. 4, it is confirmed that when the heat treatment temperature is 350° C., the range of the dose of the back surface phosphorus ion implantation 19 exhibiting the first effect for ensuring the previously described kind of ohmic contact is a range of $5.0 \times 10^{13}/cm^2$ or more, $1.8 \times 10^{14}/cm^2$ or less. Furthermore, it is confirmed that the range of the dose of the back surface phosphorus ion implantation 19 exhibiting the second effect is a range of $7.0 \times 10^{13}/cm^2$ or more, $1.7 \times 10^{14}/cm^2$ or less. Furthermore, it is confirmed that the range of the dose of the back surface phosphorus ion implantation 19 exhibiting the third effect, that is, the optimum dose, is a range of $1.0 \times 10^{14}/cm^2$ or more, $1.5 \times 10^{14}/cm^2$ or less.

It is confirmed that when the heat treatment temperature is 420° C., the range of the dose of the back surface phosphorus ion implantation 19 exhibiting the first effect is a range of $1.7 \times 10^{14}/cm^2$ or more, $3.7 \times 10^{14}/cm^2$ or less. Furthermore, it is confirmed that the range of the dose of the back surface phosphorus ion implantation 19 exhibiting the second effect is a range of $2.1 \times 10^{14}/cm^2$ or more, $3.4 \times 10^{14}/cm^2$ or less. Furthermore, it is confirmed that the optimum dose of the back surface phosphorus ion implantation 19 exhibiting the third effect is in a range of $2.4 \times 10^{14}/cm^2$ or more, $3.1 \times 10^{14}/cm^2$ or less.

It is confirmed that when the heat treatment temperature is 470° C., the range of the dose of the back surface phosphorus ion implantation 19 exhibiting the first effect is a range of $2.4 \times 10^{14}/cm^2$ or more, $4.8 \times 10^{14}/cm^2$ or less. Furthermore, it is confirmed that the range of the dose of the back surface phosphorus ion implantation 19 exhibiting the second effect is a range of $2.8 \times 10^{14}/cm^2$ or more, $4.7 \times 10^{14}/cm^2$ or less. Furthermore, it is confirmed that the optimum dose of the back surface phosphorus ion implantation 19 exhibiting the third effect is in a range of $3.3 \times 10^{14}/cm^2$ or more, $4.4 \times 10^{14}/cm^2$ or less.

Also, although not shown, it is confirmed that when the heat treatment temperature is 340° C., the range of the dose of the back surface phosphorus ion implantation 19 exhibiting the first effect is a range of $4.0 \times 10^{13}/cm^2$ or more, $1.6 \times 10^{14}/cm^2$ or less. Furthermore, it is confirmed that the range of the dose of the back surface phosphorus ion implantation 19 exhibiting the second effect is a range of $6.0 \times 10^{13}/cm^2$ or more, $1.4 \times 10^{14}/cm^2$ or less. Furthermore, it is confirmed that the optimum dose of the back surface phosphorus ion implantation 19 exhibiting the third effect is in a range of $9.0 \times 10^{13}/cm^2$ or more, $1.4 \times 10^{14}/cm^2$ or less.

In the same way, although not shown, it is confirmed that when the heat treatment temperature is 500° C., the range of the dose of the back surface phosphorus ion implantation 19 exhibiting the first effect is a range of $3.2 \times 10^{14}/cm^2$ or more, $5.6 \times 10^{14}/cm^2$ or less. Furthermore, it is confirmed that the range of the dose of the back surface phosphorus ion implantation 19 exhibiting the second effect is a range of $3.6 \times 10^{14}/cm^2$ or more, $5.3 \times 10^{14}/cm^2$ or less. Furthermore, it is confirmed that the optimum dose of the back surface phosphorus ion implantation 19 exhibiting the third effect is in a range of $4.1 \times 10^{14}/cm^2$ or more, $5.0 \times 10^{14}/cm^2$ or less.

In this way, it is confirmed that the higher the temperature of the back surface contact heat treatment, the higher the optimum dose of the back surface phosphorus ion implantation 19 becomes, and the range of the dose widens. Also, it is confirmed that at a heat treatment temperature of 380° C. or more, the minimum value of the Vf value is a practically constant value, regardless of the heat treatment temperature. It is supposed that this is because of the operational effects indicated in (i) to (iii) described in Example 1, and that the reason the operational effects indicated in (i) to (iii) are obtained is also the same as that in Example 1.

From the heretofore described results, and taking machine differences, and the like, of ion implantation devices and heat treatment devices into consideration too, there is obtained the first effect of the invention, wherein the Vf value is smaller than the Vf value (1.1 V) when not forming an n-type contact layer that ensures ohmic contact on the back surface side of an antimony-doped substrate (heretofore known example 1). In the same way, there is obtained the second effect of the invention, wherein the Vf value is 1.0 V or smaller, which is 0.1 V or more smaller than 1.1 to 1.2 V. Also, there is obtained the third effect of the invention wherein, in response to variation in the dose of the back surface phosphorus ion implantation 19, the Vf value is less than 1.0 V, and furthermore, falls within a range from the minimum value of the Vf value to 5% from the minimum value.

Consequently, the lower limit of the dose of the back surface phosphorus ion implantation 19 with which the first effect is achieved is the $4.0 \times 10^{13}/cm^2$ or more when the heat treatment temperature of the back surface contact heat treatment is 340° C. The upper limit of the dose of the back surface phosphorus ion implantation 19 with which the first effect is achieved is the $5.6 \times 10^{14}/cm^2$ or less when the heat treatment temperature of the back surface contact heat treatment is 500° C. Also, the lower limit of the dose of the back surface phosphorus ion implantation 19 with which the second effect is achieved is the $6.0 \times 10^{13}/cm^2$ or more when the heat treatment temperature of the back surface contact heat treatment is 340° C. The upper limit of the dose of the back surface phosphorus ion implantation 19 with which the second effect is achieved is the $5.3 \times 10^{14}/cm^2$ or less when the heat treatment temperature of the back surface contact heat treatment is 500° C. The lower limit of the dose of the back surface phosphorus ion implantation 19 with which the third effect is achieved is the $9.0 \times 10^{13}/cm^2$ or more when the heat treatment temperature of the back surface contact heat treatment is 340° C. The upper limit of the dose of the back surface phosphorus ion implantation 19 with which the third effect is achieved is the $5.0 \times 10^{14}/cm^2$ or less when the heat treatment temperature of the back surface contact heat treatment is 500° C.

Further still, in the range of the dose of the back surface phosphorus ion implantation 19 with which the third effect is achieved, it is more preferable that the heat treatment temperature is 380° C. or more, 500° C. or less, and that the dose of the back surface phosphorus ion implantation 19 is $1.6 \times 10^{14}/cm^2$ or more, $5.0 \times 10^{14}/cm^2$ or less, with the condition that the Vf value is 0.9 V or less with practically no dependence on the temperature of the back surface contact heat treatment, and falls within a range from the minimum value to 5% from the minimum value.

(Example 3)

Figure 5:
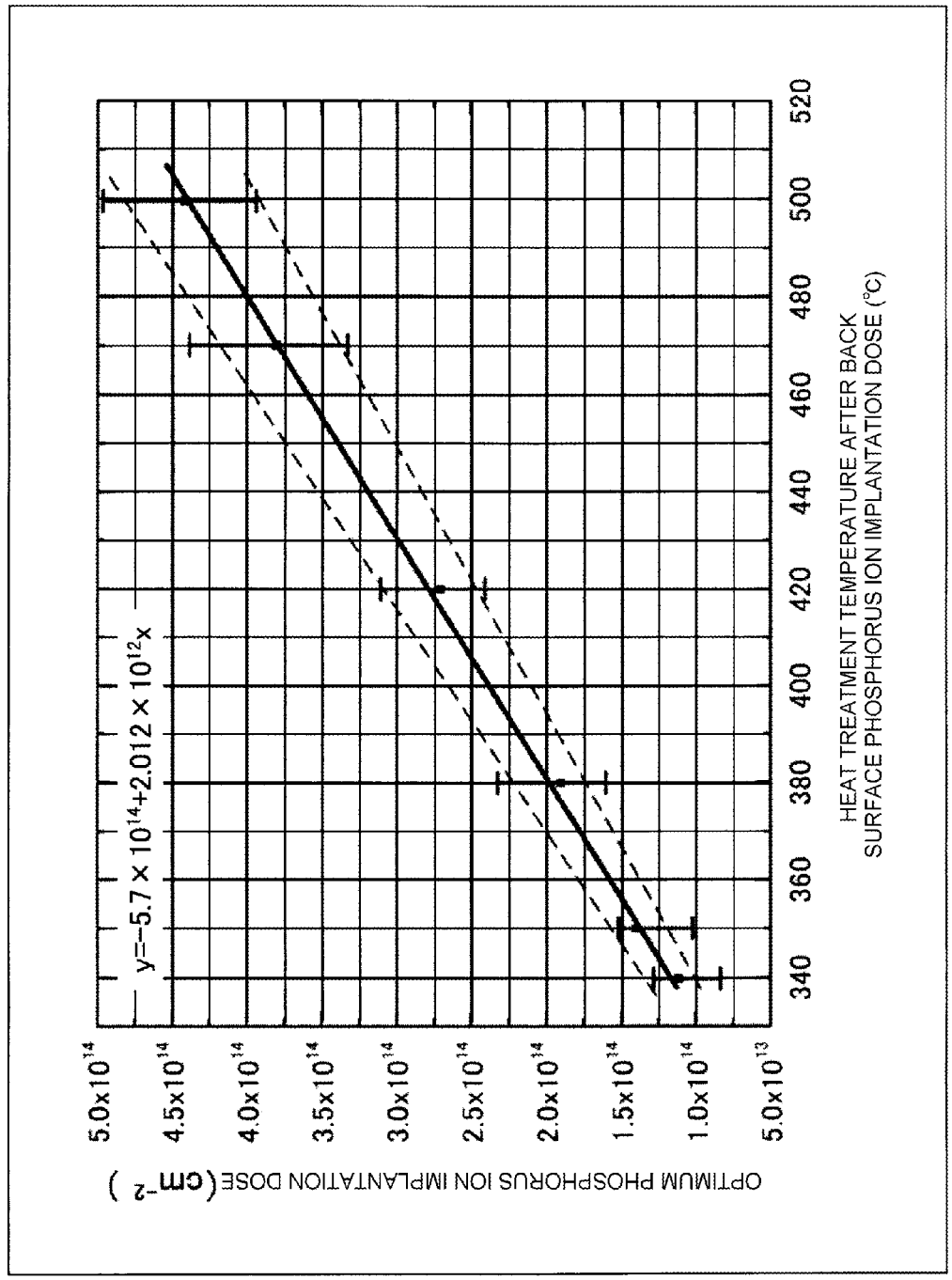
FIG. 5 is a characteristic diagram showing the relationship between the back surface phosphorus ion implantation dose with the semiconductor device manufacturing method and the back surface contact heat treatment temperature according to Example 3 of the invention.

Next, a description will be given of the relationship between the optimum dose of the back surface phosphorus ion implantation 19 with the semiconductor device manufacturing method according to the invention and the temperature of the back surface contact heat treatment. FIG. 5 is a characteristic diagram showing the relationship between the back surface phosphorus ion implantation dose with the semiconductor device manufacturing method and the back surface contact heat treatment temperature according to Example 3 of the invention. FIG. 5 shows as a linear function the relationship of the optimum doses of the back surface phosphorus ion implantation 19 (the optimum dose, shown as the optimum phosphorus ion implantation dose in FIG. 5) when the two back surface contact heat treatment temperatures 340° C. and 500° C. (FIG. 5 shows the heat treatment temperature after the phosphorus ion implantation) are added to the four kinds of back surface contact heat treatment temperature shown in FIG. 4 and described in Example 2. The vertical error bar at each of the six back surface contact heat treatment temperatures is the optimum dose (the range thereof) of the back surface phosphorus ion implantation 19 for each back surface contact heat treatment temperature. A fitting function wherein each point is fit using a linear function is shown as a solid line for the dose of the back surface phosphorus ion implantation 19 when the Vf value is the minimum at each of the six back surface contact heat treatment temperatures. The broken lines are lines passing through ±10% of the y value of the fitting function.

From the results shown in FIG. 5, it can be seen that the optimum doses of the back surface phosphorus ion implantation 19 sit neatly on a straight line. The function expression when fitting using a linear function, taking the heat treatment temperature after the back surface phosphorus ion implantation 19 to be x (° C.) and the fitting value of the dose of the back surface phosphorus ion implantation 19 to be y (/cm²), is expressed by Equation (A) below.

$$y = -5.7 \times 10^{14} + 2.012 \times 10^{12} x \quad (A)$$

The coefficient of determination is 0.99. That is, it is quite possible to express the optimum dose of the back surface phosphorus ion implantation 19 using Equation (A) as long as the back surface contact heat treatment temperature is within the range of 340° C. or more, 500° C. or less. Furthermore, the optimum dose (the range thereof) of the back surface phosphorus ion implantation 19 shown by the vertical error bar coincides well with the range of ±10% of the y value of the fitting function shown in Equation (A), and deviation is at most one-half, even at a back surface contact heat treatment temperature of less than 380° C. Consequently, provided that the dose of the back surface phosphorus ion implantation 19 is set within the range of ±10% of the y value of the fitting function shown in Equation (A) (0.9y≤x≤1.1y), it is possible to achieve the third effect without problem with any back surface contact heat treatment temperature x in the range of 340° C. or more, 500° C. or less. Also, in the same way, it goes without saying that, provided that the dose of the back surface phosphorus ion implantation 19 is set within the range of ±10% of the y value of the fitting function shown in Equation (A), the second effect of the invention is achieved without any problem at all with any back surface contact heat treatment temperature in the whole range of 340° C. or more, 500° C. or less.

The temperature of the back surface contact heat treatment may be appropriately changed in accordance with the surface device structure. For example, when applying the invention by reducing the thickness of the wafer after forming a polyimide, which is an organic material, as the passivation film 20 on the anode electrode 5 side of the wafer front surface, the heat treatment temperature is 400° C. or less. Preferably, a back surface contact heat treatment temperature lower than the curing (baking) temperature of the polyimide is good. The reason is as follows. A polyimide is such that, after a pattern formation, imidization is carried out by carrying out curing at, generally, 320° C. to 400° C. When imidizing by curing, moisture, organic solvents, and the like, contained in the film rise as gas along with a rise in the curing temperature. Consequently, when carrying out the back surface contact heat treatment after the back surface phosphorus ion implantation 19 at a temperature higher than the polyimide baking temperature, more organic gas is emitted from inside the polyimide film and adheres to (contaminates) the n-type cathode layer 1, because of which the contact between the n-type contact layer 4 and cathode electrode 6 deteriorates.

Conversely, when the back surface contact heat treatment temperature after the back surface phosphorus ion implantation 19 is lower than the polyimide curing temperature, the organic gas is exhausted during the curing, because of which hardly any organic gas is generated by the back surface contact heat treatment after the back surface phosphorus ion implantation 19, and there is no contamination of the n-type cathode layer 1. Because of this, although just one example, it is good to form the n-type contact layer 4 in the following way. Firstly, when the passivation film 20 is a polyimide, polyimide curing is carried out at 400° C. Next, after all of the front surface structure has been fabricated, the thickness of the wafer is reduced from the back side to a predetermined wafer thickness (the grinding and etching 18). Then, the back surface phosphorus ion implantation 19 is carried out to a dose of 2.0×10¹⁴/cm² into the ground back surface of the wafer, and the back surface contact heat treatment is carried out at 380° C. Subsequently, the cathode electrode 6 is deposited on the wafer back surface. By so doing, ohmic contact of the n-type contact layer 4 and cathode electrode 6 is obtained, and it is possible to obtain appropriate device characteristics.

For example, when there is no passivation film 20 on the front surface, it is possible to raise the back surface contact heat treatment temperature after the back surface phosphorus ion implantation 19 to in the region of 500° C. When using a back surface contact heat treatment temperature higher than 500° C., the aluminum used in the front surface anode electrode 5 and the silicon of the contact surface interdiffuse, causing an Si deposit that causes an increase in the contact resistance on the anode side. Because of this, it is preferable that a temperature in the region of 500° C. is the upper limit of the back surface contact heat treatment temperature. According to FIG. 5, when the back surface contact heat treatment temperature is in the region of 500° C., the optimum dose of the back surface phosphorus ion implantation 19 is in the region of $4.5 \times 10^{14}$/cm².

Also, for example, when the passivation film 20 is of an Si series, such as a silicon nitride (SiN) film or a silicon oxide (SiO₂) film, it is possible for the back surface contact heat treatment temperature after the back surface phosphorus ion implantation 19 to be in a wide range of in the region of 340° C. to 450° C., although the situation depends upon the film forming methods or the conditions thereof. In the case of an Si series passivation film 20, the aluminum of the anode electrode 5 and the passivation film 20 react when carrying out the back surface contact heat treatment at a temperature of 460° C. or higher, and leak current defects increase, which has an effect on reliability characteristics. Because of this, it is preferable that the upper limit of the back surface contact heat treatment temperature is in the region of 450° C.

(Example 4)

Verification will be made of the carrier concentration of the n-type contact layer 4 of the semiconductor device according to the invention. The carrier concentration of the n-type contact layer 4 can be evaluated by measuring the doping concentration distribution of the n-type contact layer 4 using a heretofore known spreading resistance (SR) measuring instrument. FIG. 6 is a characteristic diagram showing the back surface carrier concentration distribution of the semiconductor device according to Example 4 of the invention. FIG. 6 shows the carrier concentration (commonly called doping concentration) distribution according to SR measurement when the back surface contact heat treatment is carried out after the back surface phosphorus ion implantation 19 is carried out into the surface of the n-type cathode layer 1 (the back surface of the substrate) to the optimum dose for each heat treatment temperature of the back surface contact heat treatment.

Figure 6A:
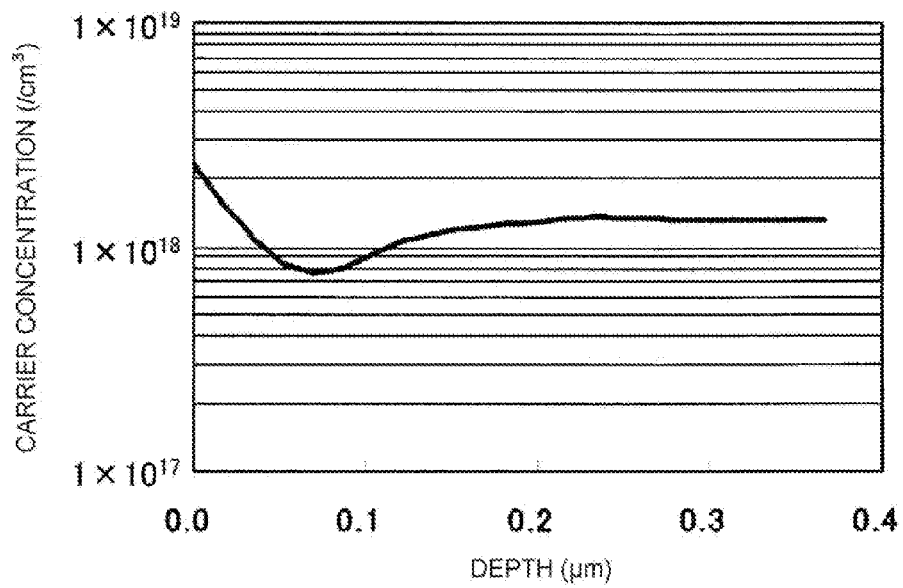
FIGS. 6(a) and 6(b) are a characteristic diagram showing the back surface carrier concentration distribution of the semiconductor device according to Example 4 of the invention.
Figure 6B:
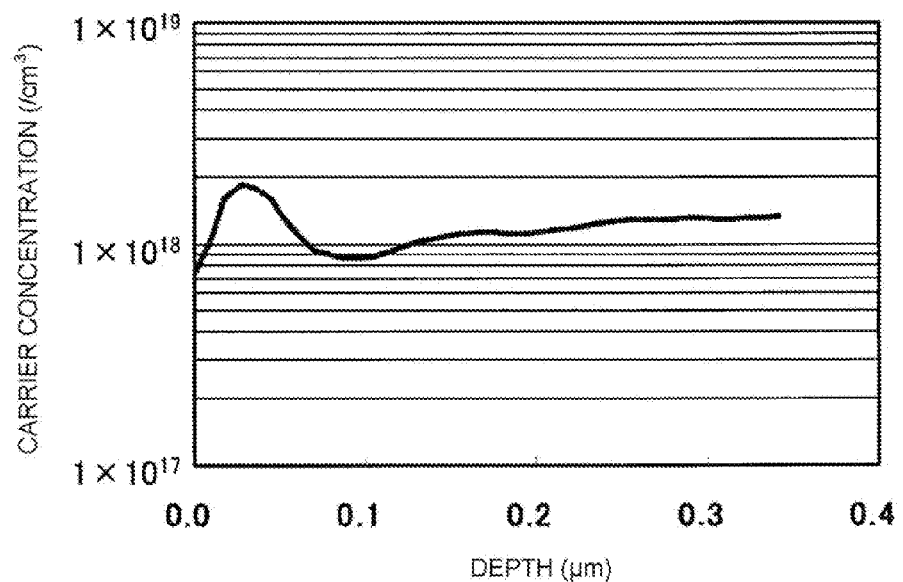

FIG. 6(a) is the carrier concentration distribution when the dose of the back surface phosphorus ion implantation 19 is $2.0 \times 10^{14}/cm^2$, and the heat treatment temperature of the back surface contact heat treatment is 380° C. FIG. 6(b) is the carrier concentration distribution when the dose of the back surface phosphorus ion implantation 19 is $2.7 \times 10^{14}/cm^2$, and the heat treatment temperature of the back surface contact heat treatment is 420° C. Solid State Measurements, Inc.'s SSM-2000 is used for the SR measurement, a sample is mounted on a stand of a predetermined angle, and the spreading resistance of a polished surface on which an oblique polishing has been carried out is measured. The acceleration energy of the back surface phosphorus ion implantation 19 is 40 keV. The conditions are that the dose of the back surface phosphorus ion implantation 19 is the optimum dose in each case, and the Vf values of the samples shown in FIGS. 6(a) and 6(b) are 0.85 V and 0.83 V, which are the respective minimum values. Also, the Vf values are in the same region as the value (0.8 V) of the high temperature heat treatment of heretofore known example 2.

In the case of FIG. 6(a), the carrier concentration of a region (that is, a side inside the n-type cathode layer 1, which is the substrate, heading toward the substrate front surface) whose depth is greater than 0.2 μm from the substrate back surface (the interface of the cathode electrode 6 and n-type contact layer 4) indicates the impurity concentration ($1.3 \times 10^{18}/cm^2$) of the antimony-doped substrate. Meanwhile, in a region whose depth is less than 0.2 μm and greater than approximately 0.03 μm from the substrate back surface, the carrier concentration is lower than the impurity concentration of the antimony-doped substrate. Further, in a region nearest the surface whose depth is less than 0.02 μm from the substrate back surface, the carrier concentration is higher than the impurity concentration of the antimony-doped substrate.

Also, in the case of FIG. 6(b), in a region whose depth is approximately 0.05 μm to 0.3 μm from the substrate back surface, the carrier concentration is lower than the impurity concentration of the antimony-doped substrate. In a region whose depth is less than 0.05 μm and greater than 0.01 μm from the substrate back surface, the carrier concentration is higher than the impurity concentration of the antimony-doped substrate. Then, furthermore, in a region nearest the surface whose depth is less than 0.01 μm from the substrate back surface, the carrier concentration is again lower than the impurity concentration of the antimony-doped substrate.

When taking into consideration that the range of the back surface phosphorus ion implantation 19 with the above-mentioned acceleration energy is 0.05 to 0.06 μm, the n-type contact layer 4 is formed to a depth of in the region of 0.1 to 0.2 μm from the substrate back surface (the surface of the n-type cathode layer 1). However, the carrier concentrations of the SR measurements in the vicinity of the phosphorus ion range are lower than the antimony concentration of the antimony-doped substrate. Further, the maximum concentration of the n-type contact layer 4 carrier concentration distribution according to the two conditions of SR measurement is in the same region as that of the antimony-doped substrate, or in a region a little higher.

The carrier concentration distribution is a distribution that clearly demonstrates (i) to (iii) above, which are the previously described characteristics of the invention. That is, as the heat treatment is carried out at a low temperature (500° C. or lower), the crystal lattices in the vicinity of the phosphorus ion range are not sufficiently recrystallized, and lattice defects (point defects, dislocation, and the like) remain. As lattice defects remain, the amount of carrier movement (in this case, the amount of electron movement) in the range vicinity decreases beyond an ideal value.

Meanwhile, a conversion formula that converts the spreading resistance into carrier concentration is embedded in conversion software, or the like, incorporated in the measuring instrument, but the value of an ideal amount of movement is normally used in the conversion formula, because of which, when the actual amount of movement decreases, the impurity concentration is calculated to be that amount lower. That is, the carrier concentrations in the vicinity of the range in FIGS. 6(a) and 6(b) are all affected by the decrease in the amount of movement. Consequently, by evaluating the carrier concentration distribution of the n-type contact layer 4 of the semiconductor device according to the invention using the SR measuring instrument, the kinds of carrier concentration distribution of FIG. 6 are obtained.

The kinds of carrier concentration distribution of FIG. 6 are not obtained unless the maximum actual activated concentration (the true doping concentration) of the n-type contact layer 4 is at least higher than $1.0 \times 10^{18}/cm^2$. The reason is that the maximum value of the carrier concentration obtained by SR measurement is higher than the antimony concentration of the antimony-doped substrate. That is, as the actual activated concentration of the n-type contact layer 4 is higher than the antimony concentration of the antimony-doped substrate, there is good, low-resistance ohmic contact between the n-type cathode layer 1 and cathode electrode 6. In this case, the carrier concentration of the n-type contact layer 4 obtained by SR measurement must be at least higher than $1.0 \times 10^{18}/cm^3$.

The carrier concentration distribution of the n-type contact layer 4 is commonly a Gaussian distribution. Provisionally taking the phosphorus electrical activation rate to be 100% when the dose of the back surface phosphorus ion implantation 19 is $5.0 \times 10^{14}/cm^2$, the maximum concentration of the n-type contact layer 4 is in the region of $5.0 \times 10^{19}/cm^3$. Because of this, when the n-type contact layer 4 is formed by the back surface contact heat treatment temperature and the optimum back surface phosphorus ion implantation 19 dose (the optimum dose) for the heat treatment temperature, it is sufficient that the maximum concentration of the n-type contact layer 4 carrier concentration distribution is at most $5.0 \times 10^{19}/cm^3$. Herein, the activation rate, referring to the electrically activated true doping concentration distribution, is defined as the value of the integrated concentration, wherein the true doping concentration across a region (in the region of 0 to 0.3 μm) of the n-type contact layer 4 is integrated, divided by the implantation dose. The true doping concentration can be obtained by a heretofore known C-V (capacitance-voltage) measurement. As the activation rate does not actually reach 100%, the maximum concentration of the n-type contact layer 4 distribution is lower than $5.0 \times 10^{19}/cm^3$. It is confirmed from verification results omitted from the drawing that the activation rate is in the region of 30% or lower with back surface contact heat treatment at a low temperature. Because of this, it is preferable that the maximum concentration of the n-type contact layer 4 carrier concentration distribution obtained by SR measurement is in the region of $1.0 \times 10^{19}/cm^3$ or lower.

Meanwhile, according to the three characteristics of the invention, the amount of carrier movement decreases owing to lattice defects remaining, as previously described. However, provided that the maximum concentration of the n-type contact layer 4 carrier concentration distribution is at least higher than $1.0 \times 10^{18}/cm^3$, which is the antimony concentration of the antimony-doped substrate, the obtaining of good, low-resistance ohmic contact between the n-type contact layer 4 and cathode electrode 6 is as in the previously described Example 4. Furthermore, it is preferable that the maximum concentration of the n-type contact layer 4 carrier concentration distribution is higher than $3.0×10^{18}/cm^3$, as this is definitely higher than the antimony concentration of the antimony-doped substrate.

Also, it is preferable that the depth of the n-type contact layer 4 is such that the position at which the carrier concentration of the n-type contact layer 4 coincides with the antimony concentration of the antimony-doped substrate (the n-type cathode layer 1) is shallower than 0.5 μm, as it is possible for the carrier concentration to be at a maximum in the vicinity of the outermost layer in contact with the cathode electrode 6. More preferably still, it is good when the depth of the n-type contact layer 4 is less than 0.3 μm.

(Example 5)

Figure 7:
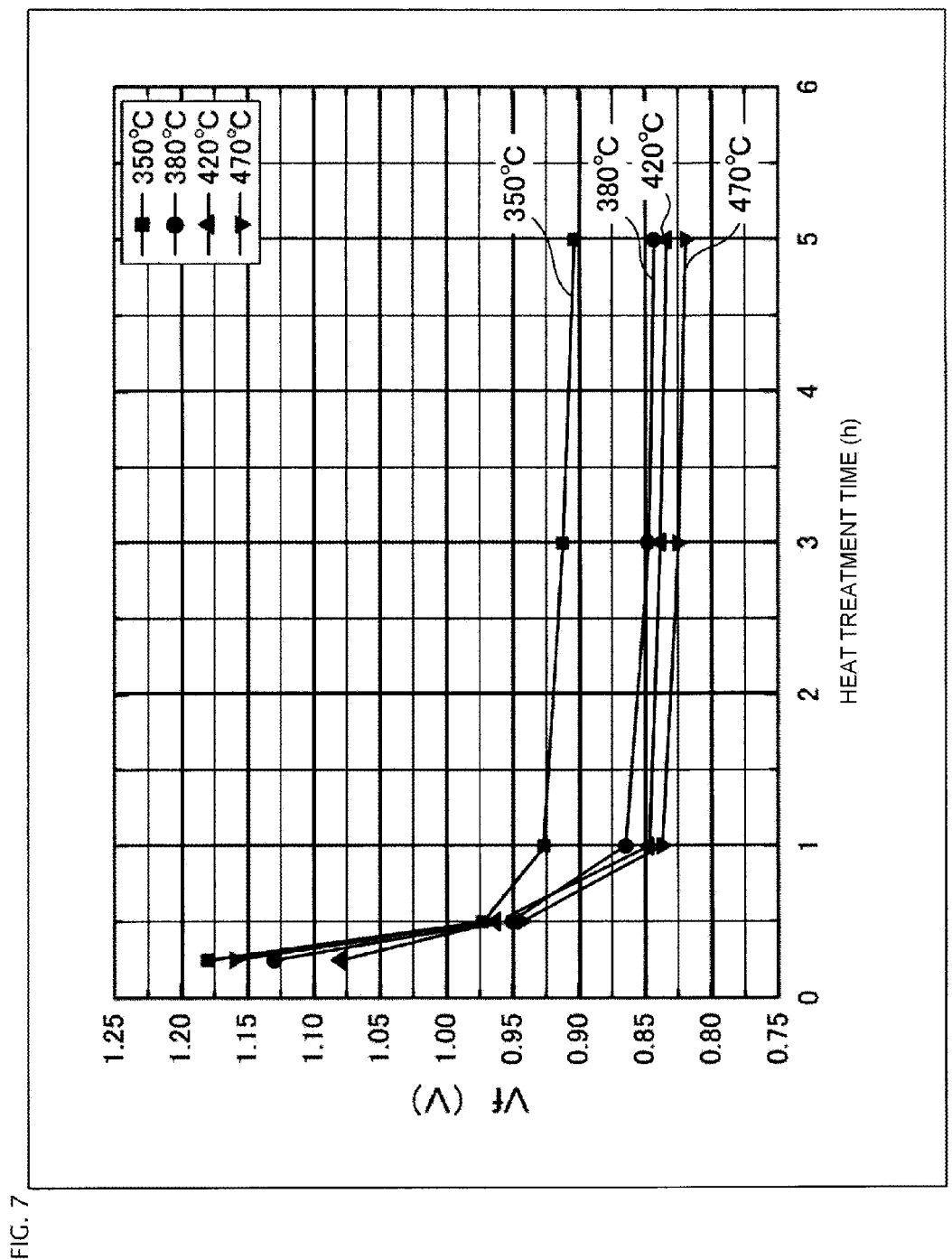
FIG. 7 is a characteristic diagram showing the relationship between the forward voltage characteristics of the semiconductor device and the back surface contact heat treatment time according to Example 5 of the invention.

Next, it is good when the temperature maintaining time of the back surface contact heat treatment after the back surface phosphorus ion implantation 19 lasts for 30 minutes or more. FIG. 7 is a characteristic diagram showing the relationship between the forward voltage characteristics of the semiconductor device and the back surface contact heat treatment time according to Example 5 of the invention. From the results shown in FIG. 7, although there is some difference depending on the back surface contact heat treatment temperature, it is confirmed that the diode Vf value is 1.0 V or higher for a back surface contact heat treatment time of less than 30 minutes and, after decreasing considerably from 30 to 60 minutes of the back surface contact heat treatment time, barely changes at all for the back surface contact heat treatment time after 60 minutes (1 hour). When the back surface contact heat treatment time is less than 30 minutes, it is supposed that the activation of the phosphorus impurity implanted in the back surface phosphorus ion implantation 19 is insufficient. Consequently, it is preferable that the back surface contact heat treatment time after the back surface phosphorus ion implantation 19 is 30 minutes or more, and more preferably still, it is good when it is one hour or more.

According to Embodiment 1, as heretofore described, it is possible, by employing an n-type contact layer having the characteristics of (i) to (iii) above, for the contact between a first conductivity type contact layer and first electrode to be a low-resistance ohmic contact equivalent to that when carrying out heat treatment at a high temperature (800° C. or higher), even when carrying out heat treatment on an ion implanted first conductivity type impurity at a low temperature of 500° C. or lower.

Also, according to the invention, it is possible to bring the n-type contact layer and cathode electrode into ohmic contact with a back surface contact heat treatment at a low temperature of 500° C. or lower, because of which, it is possible to form a front surface element structure on the front surface of the wafer before reducing the thickness by grinding the back surface of the wafer. Because of this, it is possible to reduce the number of processing steps after reducing the thickness of the wafer, and thus possible to reduce mechanical stress exerted by a wafer chuck, or the like, during the manufacturing process. Consequently, it is possible to prevent wafer cracking or scratching from occurring. Also, as it is possible to lower the heat treatment temperature during the manufacturing process, it is possible to reduce wafer warpage.

According to Embodiment 1, it is possible to obtain a good ohmic contact between the n-type contact layer and cathode electrode even when using an antimony-doped substrate, because of which, it is no longer necessary to use a substrate doped with a high concentration of arsenic formed using arsenic, which has a higher solid solubility than antimony. Because of this, it is possible to avoid problems that occur when using an arsenic-doped substrate.

(Embodiment 2)

Figure 8:
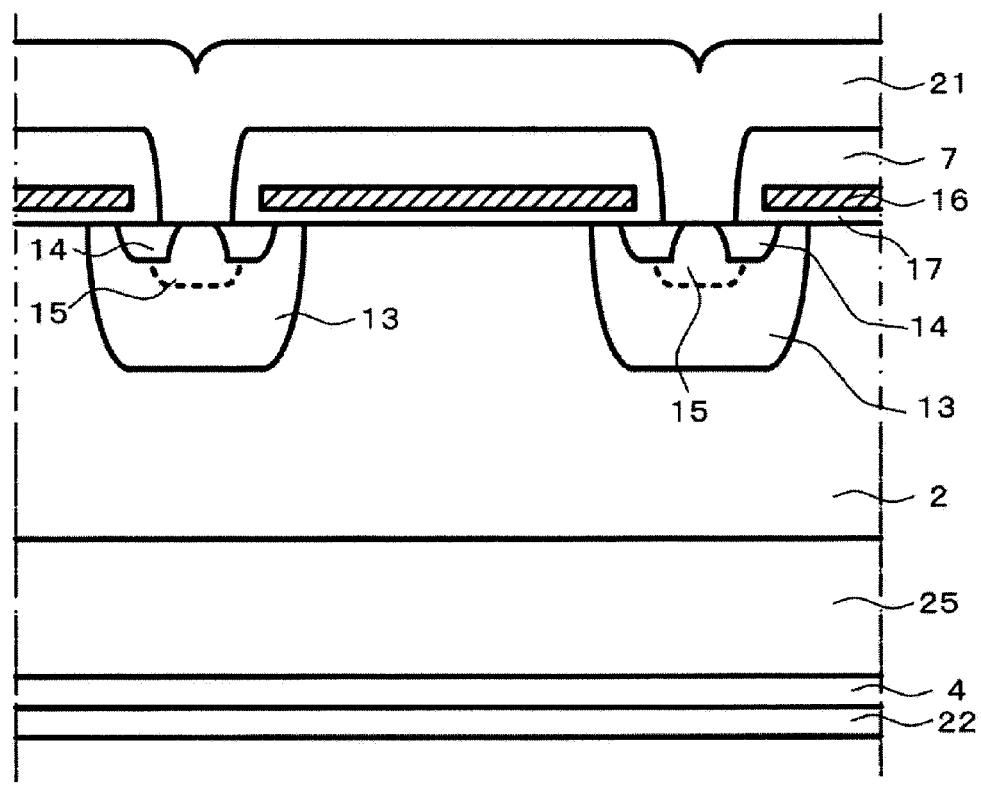
FIG. 8 is a sectional view showing a main portion of a semiconductor device according to Embodiment 2 of the invention.
Figure 9A:
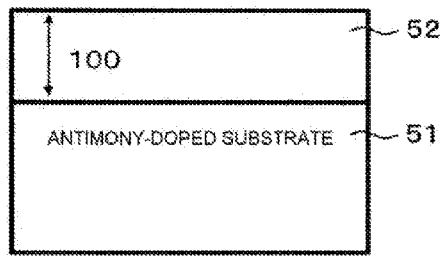
FIGS. 9(a)-9(f) are sectional views showing conditions partway through the manufacture of a heretofore known semiconductor device.
Figure 9D:
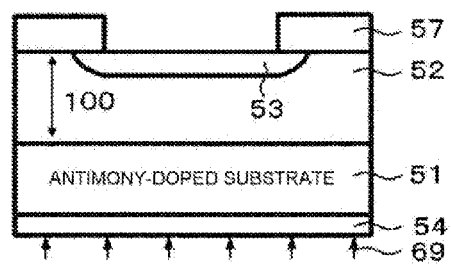
Figure 9B:
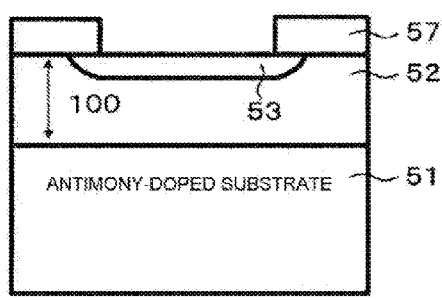
Figure 9E:
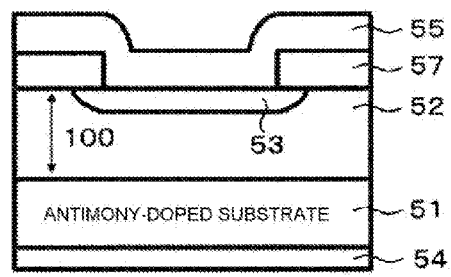
Figure 9C:
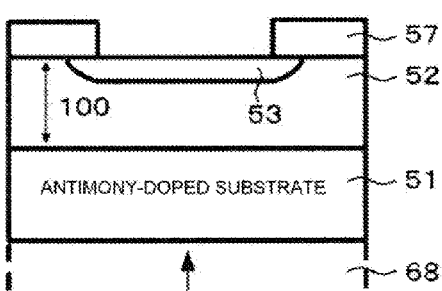
Figure 9F:
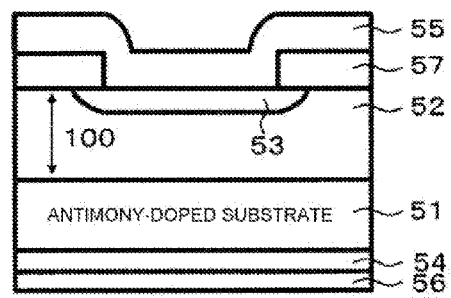

A description will be given of a semiconductor device according to Embodiment 2, with an insulated gate field-effect transistor (MOSFET) as an example. FIG. 8 is a sectional view showing a main portion of the semiconductor device according to Embodiment 2 of the invention. FIG. 8 shows an example wherein the n-type contact layer 4 of the semiconductor device according to the invention is applied to a vertical insulated gate field-effect transistor (MOSFET). That is, a difference in the semiconductor device according to Embodiment 2 from the semiconductor device (diode) according to Embodiment 1 is that a MOS gate (an insulated gate formed of a metal, an oxide film, and a semiconductor) structure is formed on the surface of the n⁻ type drift layer 2. As the MOS gate structure may be a heretofore known structure, it is sufficient that it is, for example, the structure shown in FIG. 8.

Specifically, a p-type base layer 13 is selectively formed in a surface (the surface on the side opposite to an n-type drain layer 25 side) of the n⁻ type drift layer 2. An n-type source layer 14 is selectively formed inside the p-type base layer 13. Also, a p-type contact layer 15 may be formed inside the p-type base layer 13 in order to reduce the contact resistance with a source electrode 21. The n-type source layer 14, p-type base layer 13, and n⁻ type drift layer 2 are adjacent to each other in the silicon substrate surface. A gate electrode 16 is formed across a gate oxide film (dielectric) 17 on a portion of the surface of the p-type base layer 13 sandwiched by the n-type source layer 14 and n⁻ type drift layer 2.

The gate electrode 16 is isolated from the source electrode 21 across the interlayer dielectric 7. The source electrode 21 is connected to the p-type base layer 13 and n-type source layer 14. Meanwhile, the n-type contact layer 4 having the characteristics of (i) to (iii) above is formed on the back surface of the silicon substrate (n-type drain layer 25) formed by doping with antimony, in the same way as in Embodiment 1. Further, a drain electrode 22 is formed so as to be in contact with the n-type contact layer 4. Regarding a manufacturing method of this kind of MOSFET according to Embodiment 2, it is sufficient that the MOS gate structure is formed when forming the front surface element structure with the diode manufacturing method according to Embodiment 1.

A planar gate MOSFET is shown in FIG. 8, but a heretofore known trench gate MOSFET may also be used.

According to Embodiment 2, as heretofore described, the operational effects of (i) to (iii) above being achieved in the same way as in Embodiment 1 by applying the invention to a MOSFET and providing the n-type contact layer 4 having the characteristics of (i) to (iii) above is exactly the same as Embodiment 1. That is, according to Embodiment 2, it is possible to realize a low-resistance ohmic contact between the n-type contact layer 4 and drain electrode 22.

(Embodiment 3)

A description will be given of a semiconductor device according to Embodiment 3. The semiconductor device (MOSFET) according to Embodiment 2 may also be applied to an intelligent power switch (IPS). An IPS is a switching element wherein, as well as the vertical MOSFET according to Embodiment 2 shown in FIG. 8 and a heretofore known edge termination withstand structure, a control CMOS (complementary MOS) circuit, a level shift circuit, a separation region that separates inter-circuit potential, and the like, are included on the surface of the same n⁻ type drift layer 2. By the n-type contact layer 4 having the characteristics of (i) to (iii) above of the semiconductor device according to the invention being formed on the back surface of the silicon substrate (the n-type drain layer 25) of the IPS, it is possible to realize a low-resistance ohmic contact between the n-type contact layer 4 and drain electrode 22 in the same way as in Embodiment 2.

According to Embodiment 3, as heretofore described, it is possible to obtain the same effects as in Embodiments 1 and 2.

Heretofore, a description of the invention has been given with a diode, a MOSFET, and an IPS as examples but, not being limited to the heretofore described embodiments, the invention can be applied to various configurations of device wherein the electrical contact between a semiconductor layer and a metal electrode is an ohmic contact. Also, although phosphorus is ion implanted into the back surface of an antimony-doped substrate (a back surface phosphorus ion implantation) in order to form an n-type contact layer on the back surface of the antimony-doped substrate in each embodiment, an n-type impurity other than phosphorus may be used as the dopant used in the ion implantation. Also, a first conductivity type is taken to be an n-type and a second conductivity type is taken to be a p-type in each embodiment, but the invention is established in the same way when the first conductivity type is a p-type and the second conductivity type an n-type.

As heretofore described, the semiconductor device and semiconductor device manufacturing method according to the invention are useful in a power semiconductor device used in a power conversion device such as a power circuit or motor drive inverter.

What is claimed is:

1. A semiconductor device comprising:
   a first conductivity type semiconductor substrate; wherein a dopant of the semiconductor substrate is antimony;
   a first conductivity type contact layer, provided on the back surface of the semiconductor substrate, with a concentration higher than that of the semiconductor substrate; and
   a first electrode in contact with the contact layer, wherein the contact layer is doped with phosphorus and includes lattice defects,
   the diffusion depth of the contact layer from the interface with the first electrode into the semiconductor substrate is 0.5 μm or less, and
   wherein the contact layer includes both a region of higher concentration than that of the semiconductor substrate, and a region of lower concentration region than that of the semiconductor substrate.

2. The semiconductor device according to claim 1, wherein the maximum carrier concentration of the contact layer is greater than $1.0 \times 10^{18}/cm^3$ and less than $5.0 \times 10^{19}/cm^3$.

3. The semiconductor device according to claim 1, wherein the semiconductor substrate includes silicon.

4. The semiconductor device according to claim 1, wherein the contact layer includes antimony.

5. The semiconductor device according to claim 1, wherein the maximum carrier concentration of the contact layer is greater than $3.0 \times 10^{18}/cm^3$ and less than $1.0 \times 10^{19}/cm^3$.

6. The semiconductor device according to claim 1, wherein the semiconductor substrate is doped with antimony, and the concentration of antimony in the semiconductor substrate is $1.0 \times 10^{18}/cm^3$ or more, $3.0 \times 10^{18}/cm^3$ or less.

7. The semiconductor device according to claim 1, wherein titanium is included in a portion of the first electrode on the side in contact with the contact layer.

8. The semiconductor device according to claim 1, the semiconductor device further comprising:
   a first conductivity type drift layer, provided on the front surface of the semiconductor substrate, with a concentration lower than that of the semiconductor substrate,
   a second conductivity type base region provided in a surface layer on the side of the draft layer opposite to that of the semiconductor substrate; and
   a second electrode electrically connected to the base region.

9. The semiconductor device according to claim 1, further comprising:
   a first conductivity type source region, provided inside the base region, with a concentration higher than that of the drift layer, and
   a gate electrode provided across a dielectric on a portion of the surface of the drift layer sandwiched by the source region and base region.

10. The semiconductor device according to claim 1, wherein the contact between the first conductivity type contact layer and the first electrode is a low-resistance ohmic contact.

* * * * *